United States Patent
Brown et al.

(10) Patent No.: US 10,222,524 B2
(45) Date of Patent: Mar. 5, 2019

(54) OPTICAL FILTER WITH SELECTIVE TRANSMITTANCE AND REFLECTANCE

(71) Applicant: Vision Ease, LP, Ramsey, MN (US)

(72) Inventors: Jeff Brown, St. Louis Park, MN (US); Michael L. Marshall, Andover, MN (US); Michael S. Boulineau, Forest Lake, MN (US)

(73) Assignee: Vision Ease, LP, Ramsey, MN (US)

( * ) Notice: Subject to any disclaimer, the term of this patent is extended or adjusted under 35 U.S.C. 154(b) by 16 days.

(21) Appl. No.: 15/293,074

(22) Filed: Oct. 13, 2016

(65) Prior Publication Data

US 2017/0102489 A1    Apr. 13, 2017

Related U.S. Application Data

(60) Provisional application No. 62/241,030, filed on Oct. 13, 2015.

(51) Int. Cl.

| | |
|---|---|
| *G02C 7/10* | (2006.01) |
| *G02B 5/22* | (2006.01) |
| *C23C 14/06* | (2006.01) |
| *C23C 14/20* | (2006.01) |
| *C23C 14/34* | (2006.01) |
| *G02B 5/20* | (2006.01) |
| *G02B 5/26* | (2006.01) |
| *G02B 5/28* | (2006.01) |
| *C23C 14/08* | (2006.01) |
| *C23C 14/10* | (2006.01) |

(52) U.S. Cl.
CPC .............. *G02B 5/22* (2013.01); *C23C 14/0641* (2013.01); *C23C 14/083* (2013.01); *C23C 14/10* (2013.01); *C23C 14/205* (2013.01); *C23C 14/34* (2013.01); *G02B 5/208* (2013.01); *G02B 5/26* (2013.01); *G02B 5/283* (2013.01); *G02B 5/285* (2013.01); *G02C 7/10* (2013.01); *G02C 7/107* (2013.01)

(58) Field of Classification Search
CPC .......... G02C 7/10; G02C 7/104; G02C 7/107; G02B 5/20; G02B 5/22; G02B 5/26; G02B 5/28; G02B 5/208; G02B 5/283; G02B 5/285
USPC ................ 359/885–892; 351/159.49, 159.59, 351/159.62, 159.65
See application file for complete search history.

(56) References Cited

U.S. PATENT DOCUMENTS

| | | |
|---|---|---|
| 2,333,051 A | 10/1943 | Smith |
| 4,108,827 A | 8/1978 | La Liberte |
| 4,139,694 A | 2/1979 | Laliberte |

(Continued)

FOREIGN PATENT DOCUMENTS

EP    0145201 A1    6/1985

OTHER PUBLICATIONS

Johnson et al., Optical Constants of the Noble Metals, Physical Review B. vol. 6, No. 12. Dec. 15, 1972, Retrieved from internet: <https://www.clearrice.edu/elec603/spring2008/Selecting_a_Paperfiles/Phys%20%20Rev% 20%20B%201972%20Johnson.pdf> p. 4374.

(Continued)

*Primary Examiner* — Darryl J Collins
(74) *Attorney, Agent, or Firm* — Inskeep IP Group, Inc.

(57) ABSTRACT

An optical filter providing selective transmittance of target wavelengths of light and tunable, differential front and back surface reflectance.

11 Claims, 18 Drawing Sheets

(56) References Cited

U.S. PATENT DOCUMENTS

| | | | |
|---|---|---|---|
| 4,422,721 A | 12/1983 | Hahn et al. |
| 4,793,669 A | 12/1988 | Perilloux |
| 4,896,928 A | 1/1990 | Perilloux et al. |
| RE33,729 E | 10/1991 | Perilloux |
| 5,059,561 A | 10/1991 | Ciolek et al. |
| 5,177,509 A | 1/1993 | Johansen et al. |
| 5,182,588 A | 1/1993 | Maurer et al. |
| 5,371,138 A | 12/1994 | Schaefer et al. |
| 5,400,175 A | 3/1995 | Johansen et al. |
| 5,521,765 A | 5/1996 | Wolfe |
| 5,719,705 A | 2/1998 | Machol |
| 5,751,481 A | 5/1998 | Dalzell et al. |
| 5,798,182 A | 8/1998 | LeFebvre et al. |
| 5,922,246 A | 7/1999 | Matsushita et al. |
| 5,949,518 A | 9/1999 | Belmares et al. |
| 6,419,873 B1 | 7/2002 | Buazza et al. |
| 6,464,484 B1 | 10/2002 | Powers et al. |
| 6,486,226 B2 | 11/2002 | Al-Akhdar et al. |
| 6,557,734 B2 | 5/2003 | Buazza et al. |
| 6,632,535 B1 | 10/2003 | Buazza et al. |
| 6,634,879 B2 | 10/2003 | Buazza et al. |
| 6,641,261 B2 | 11/2003 | Wang et al. |
| 6,770,692 B1 | 8/2004 | Kobayashi et al. |
| 6,777,459 B2 | 8/2004 | Al-Akhdar et al. |
| 6,926,510 B2 | 8/2005 | Buazza et al. |
| 6,939,899 B2 | 9/2005 | Buazza et al. |
| 6,960,312 B2 | 11/2005 | Powers et al. |
| 6,964,479 B2 | 11/2005 | Buazza et al. |
| 7,044,429 B1 | 5/2006 | Foreman et al. |
| 7,079,920 B2 | 7/2006 | Buazza et al. |
| 7,144,598 B2 | 12/2006 | Moravec et al. |
| 7,169,702 B2 | 1/2007 | El-Hibri |
| 7,217,440 B2 | 5/2007 | Jallouli et al. |
| 7,278,737 B2 | 10/2007 | Mainster et al. |
| 8,004,764 B2 | 8/2011 | Artsyukhovich et al. |
| 8,106,108 B2 | 1/2012 | Chen |
| 8,133,414 B2 | 3/2012 | Gallas et al. |
| 8,469,512 B2 | 6/2013 | Croft et al. |
| 8,541,526 B2 | 6/2013 | Jethmalani et al. |
| 9,057,887 B1 | 6/2015 | Jaglan |
| 2006/0019114 A1 | 1/2006 | Thies et al. |
| 2009/0120874 A1 | 5/2009 | Jensen et al. |
| 2009/0141357 A1 | 6/2009 | Kamura et al. |
| 2009/0189303 A1 | 7/2009 | Diggins et al. |
| 2010/0014144 A1 | 1/2010 | Ota |
| 2012/0019767 A1 | 1/2012 | Cadet et al. |
| 2012/0019915 A1 | 1/2012 | Yan et al. |
| 2013/0216807 A1 | 8/2013 | Wakefield et al. |
| 2013/0222913 A1 | 8/2013 | Tomoda et al. |
| 2015/0131047 A1 | 5/2015 | Saylor et al. |
| 2015/0234208 A1* | 8/2015 | De Ayguavives ..... G02C 7/107 351/159.62 |
| 2015/0323705 A1* | 11/2015 | Hart ................ G02B 1/18 359/580 |
| 2016/0266281 A1 | 9/2016 | Marshall et al. |
| 2016/0274276 A1 | 9/2016 | Brown et al. |
| 2017/0003520 A1* | 1/2017 | Iwasaki ................ G02B 1/115 |

OTHER PUBLICATIONS

Gracia et al., SiO2/TiO2 thin films with variable refractive index prepared by ion beam induced and plasma enhanced chemical vapor deposition. Thin Solid Filmc 600. Dec. 16, 2005. Retrieved from internet: <http://sincaticmse.csic.es/articulosiTSF2006_500_19_gracia.pdf> p. 19.

* cited by examiner

| Layer / Material | Layer Thickness (nm) |
|---|---|
| Glass Substrate | NA |
| $TiO_2$-A | 30.70 |
| Au | 8.00 |
| $SiO_2$ | 59.10 |
| $TiO_2$-A | 23.80 |
| $SiO_2$ | 78.60 |
| $TiO_2$-A | 47.90 |
| $SiO_2$ | 49.00 |
| $TiO_2$-A | 29.00 |
| Air | NA |

| Layer / Material | Layer Thickness (nm) |
|---|---|
| Glass Substrate | NA |
| $TiO_2$-A | 51.80 |
| W | 4.00 |
| $SiO_2$ | 5.70 |
| $TiO_2$-A | 68.50 |
| $SiO_2$ | 81.40 |
| $TiO_2$-A | 26.40 |
| $SiO_2$ | 59.00 |
| $TiO_2$-A | 42.60 |
| $SiO_2$ | 126.30 |
| Air | NA |

| Layer / Material | Layer Thickness (nm) |
|---|---|
| Glass Substrate | NA |
| $TiO_2$-A | 30.70 |
| Ni | 4.00 |
| $SiO_2$ | 59.20 |
| $TiO_2$-A | 23.8 |
| $SiO_2$ | 78.50 |
| $TiO_2$-A | 47.90 |
| $SiO_2$ | 49.00 |
| $TiO_2$-A | 29.00 |
| $SiO_2$ | 136.20 |
| Air | NA |

| Layer / Material | Layer Thickness (nm) |
|---|---|
| Glass Substrate | NA |
| $TiO_2$-A | 35.00 |
| $SiO_2$ | 49.97 |
| $TiO_2$-A | 38.80 |
| $SiO_2$ | 74.30 |
| $TiO_2$-A | 38.10 |
| $SiO_2$ | 40.80 |
| Ni | 4.00 |
| $TiO_2$-A | 29.20 |
| $SiO_2$ | 79.40 |
| Air | NA |

| Layer / Material | Layer Thickness (nm) |
|---|---|
| Glass Substrate | NA |
| $ZrO_2\_MC$ | 59.1 |
| Zr | Time Dependent |
| $ZrO_2\_MC$ | 78.4 |
| $SiO_2$ | 81.0 |
| $ZrO_2\_MC$ | 29.5 |
| $SiO_2$ | 59.0 |
| $ZrO_2\_MC$ | 48.9 |
| $SiO_2$ | 127.0 |
| Air | NA |

| Layer / Material | Layer Thickness (nm) |
|---|---|
| Glass Substrate | NA |
| $ZrO_2\_MC$ | 58.76 |
| Ni | 0.5 |
| $ZrO_2\_MC$ | 77.11 |
| $SiO_2$ | 83.21 |
| $24.90ZrO_2\_MC$ | 24.90 |
| $63.49SiO_2$ | 63.49 |
| $ZrO_2\_MC$ | 35.95 |
| $SiO_2$ | 122.55 |
| Air | NA |

| Layer / Material | Layer Thickness (nm) |
|---|---|
| Glass Substrate | NA |
| $ZrO_2\_MC$ | 55.32 |
| Ni | 4.61 |
| $ZrO_2\_MC$ | 92.92 |
| $SiO_2$ | 48.01 |
| $24.90ZrO_2\_MC$ | 44.32 |
| $63.49SiO_2$ | 38.25 |
| $ZrO_2\_MC$ | 54.61 |
| $SiO_2$ | 111.47 |
| Air | NA |

OPTICAL FILTER WITH SELECTIVE TRANSMITTANCE AND REFLECTANCE

RELATED APPLICATIONS

This application claims benefit of and priority to U.S. Provisional Application Ser. No. 62/241,030 filed Oct. 13, 2015 entitled Optical Filter with selective transmittance and Reflectance, which is hereby incorporated herein by reference in its entirety.

FIELD OF THE INVENTION

The present invention relates to optical filters and, more particularly, to optical filters having selective transmittance and tunable, differential front and back surface reflectance, optical articles employing the same, and methods of forming thereof.

BACKGROUND OF THE INVENTION

It is known in the art that ultraviolet (UV), wavelengths of light between 280 nm and 380 nm under ANSI standards and 400 nm under other AUS/NZ standards, are harmful to the human eye. More recently, it has also started to become apparent that high energy visible light, HEV, which is characterized as having wavelengths from 400 nm up to 500 nm, also poses possible threats to eye health and other living tissue. This risk occurs at the highest energies, or lowest wavelength, of the HEV spectrum. This light range has also been attributed to other beneficial biological factors such as regulation of circadian rhythms. Hence, applications are being developed to selectively reduce and or/control these high energy, UV and HEV wavelengths incident upon the eye. One approach to reducing UV and HEV wavelength incident upon the eye is to employ optical filters in or on eyewear.

Such filters can be created in a variety of ways, including through physical vapor deposition, PVD, techniques. Coatings to reduce and control the reflection from the surface of a lens, referred to as antireflection, AR, coatings are commonly employed. Examples of AR coatings can be found in U.S. Pat. No. 6,165,598 to Nelson; U.S. Pat. No. 8,425,035 to Blunckenhagen; U.S. Pat. No. 8,007,901 to Beinat; and U.S. Pat. No. 6,768,581 to Yip, which are incorporated herein in their entireties. Macleod, Angus; Thin Film Optical Filters ($3^{rd}$ Edition); IOP, 2001, which is incorporated herein in its entirety, provides detailed information and theory behind the design of AR coatings and optical filters.

Common considerations in the forming of AR coatings are 1) achieving high transmission throughout the visible spectrum, e.g. from 380 to 780 nm; 2) achieving a neutral or appealing reflected color; 3) controlling of off angle color; and 4) providing layers in or on the coating for improved cleanability, e.g. hydrophobicity or oleophobicity.

Generally, AR coatings employ alternating layers of at least two materials. The materials are chosen such that one material has a refractive index of less than 1.6, e.g. silicon dioxide, $SiO_2$, and the other material has a refractive index greater than 1.6, e.g. titanium dioxide, $TiO_2$, or, zirconium dioxide, $ZrO_2$. More than two different materials may also be employed to achieve the desired characteristics of the coating. In addition, a conductive layer may be employed, such as indium tin oxide, as described in U.S. Pat. No. 6,852,406 to Marechal, which is incorporated herein in its entireties, or a thin metallic layer, such as 0.2 nm of Au, as described in U.S. Pat. No. 8,007,901 to Beinat, to impart anti-static properties to the coating. In these cases, the conductive layer is chosen to maximize transmission while maintaining the required anti-static property, i.e. absorption of light by the layer is minimized to be less than 5 percent through the visible, for example, less than 1 percent.

In an optical filter system, light is transmitted (T), reflected (R) or absorbed (A). If the total incident light intensity is $I_o$ then:

$I_o = T + R + A.$

Furthermore, as described in Macleod, transmission is invariant, i.e. remains constant and does not depend on which side of a lens one is looking. Absent absorption in the substrate, e.g. optical lens material, the above relationship creates a situation in which the reflection from the front of a lens and the back of the lens must be equal. The above referenced patents do not contain any appreciable absorption in the visible portion of the spectrum since they are constructed from transparent dielectric materials. Therefore, the reflection is identical when viewed from either side of the lens, ignoring any effect of the substrate.

This poses a challenge for the design of optical filters for blocking HEV portions of the spectrum. The most common method of blocking such wavelengths is through an edge filter that has a high reflection below a specified wavelength and low reflection above this wavelength. However, achieving a high front surface reflection necessarily results in a high back surface reflection, even from a coating applied to only a front of a lens. Hence, the HEV wavelengths will be reflected into the eye from the back surface. In certain applications, this problem can become more acute. For example, the intensity of blue emission from modern HID headlamps on cars can be very distracting to drivers of oncoming cars. The blue light of the HID headlamp is scattered on surfaces leading to glare. This problem gets worse with the age of the driver. The use of an "edge" optical filter on eye glasses can help to reduce this problem by reflecting the blue light from the front of the lens. However, light from cars behind the driver will be reflected into the eyes. This is true even if the edge filter is only applied to the front of the lens, especially since most optical lens materials will not preferentially attenuate blue light. This effect can be very distracting to drivers and can even momentarily blind a driver due to passing cars.

U.S. Pat. No. 8,870,374 to Cado, which is incorporated herein in its entirety, attempts to address this problem in the context of UV light by providing front and back reflection of a lens that differ in their respective UV spectrum. This approach is based upon the UV absorption inherent in the lens material employed and upon the application of different AR coatings on the front and the back of the lens. Specifically, a low UV reflection AR is applied to the back of the lens to prevent reflection into the wearers eyes. The front AR can be independently designed and UV blocking provided by the lens material. Therefore, the ability to achieve efficient UV blocking requires the substrate or lens to provide efficient blocking characteristics. Furthermore, the designs shown in Cado have symmetric reflections from the front and back of the AR coatings from each of the coatings, ignoring any absorption in the substrate.

U.S. Pat. No. 3,679,291 to Apfel, which is incorporated herein in its entirety, describes coatings employing absorbing layers to influence the back reflection and front reflection from a surface independently. In this context "front" refers to the side of the lens containing the optical coating, i.e. one side of the coating is air and the other side of the coating is proximate the substrate or lens, and back is the surface opposing the optical coating. The design demonstrates large differences in the front and back reflections, however, with a highly undesirable transmission that is lower than 60 percent. Furthermore, the designs in Apfel are limited to broad transmission throughout the visible spectrum. U.S. Pat. No. 5,521,759 to Dobrowolski describes employing absorbing layers in a filter design with the specific purpose of side band suppression in notch transmission filters, however, also without specific concern for maintaining transmission.

Hence, there exists a need in the field for alternate filter designs and systems that independently controls the reflection of desired wavelengths of light from the front and the back surfaces of a lens, that is independent of any absorption that may be present in the lens material, that does not require application of both front side and backside coatings, and, hence, that is more economical to produce. There also exists a need in the field for alternate filter designs for other optical and aesthetic effects, such as achromaticity, without concern for increasing the back reflection into the eye.

OBJECTS AND SUMMARY OF THE INVENTION

The present invention provides optical filters, filter designs, and optical article and systems that independently controls the reflection of desired wavelengths of light from the front and the back surfaces of the filter or optical article, that is independent of any absorption that may be present in the substrate of the optical article, that does not require application of both front side and backside coatings on the optical article, and, hence, that is more economical to produce. These objectives are achieved, in part, by providing an optical filter comprising; a plurality of alternating layers of transparent dielectric materials having different refractive indices; at least one layer of a metallic absorbing material having a thickness of less than 50 nm; and a percent transmission of the optical filter greater than 70 percent. The plurality of alternating layers of transparent dielectric materials comprising a material having a refractive index of less than or equal to 1.6. The plurality of alternating layers of transparent dielectric materials comprising a material having a refractive index of greater than 1.6. The at least one layer of a metallic absorbing material comprising a conductive material. The at least one layer of a metallic absorbing material comprising gold, titanium nitride and/or zirconium nitride. The at least one layer of a metallic absorbing material interposed directly between two layers of the plurality of alternating layers of transparent dielectric materials having different refractive indices. The at least one layer of a metallic absorbing material interposed directly within a layer of the plurality of alternating layers of transparent dielectric materials. The at least one layer of a metallic absorbing material positioned within the plurality of alternating layers of transparent dielectric materials towards a front side of the optical filter. The at least one layer of a metallic absorbing material positioned within the plurality of alternating layers of transparent dielectric materials towards a backside of the optical filter.

These objectives are further achieved, in part, by providing an ophthalmic lens comprising a lens substrate; and an optical filter having a front surface and a back surface attached to a front surface of the lens substrate; a percent reflectance from a front surface of the ophthalmic lens 50 percent greater than a percent reflectance from the back surface of the optical filter. Wherein, the lens substrate is thermoplastic. Wherein, the lens substrate is a curable liquid monomer mixture or a curable urethane based prepolymer composition. The ophthalmic article further comprising a functional laminate. The optical filter comprising a plurality of alternating layers of transparent dielectric materials having different refractive indices; and at least one layer of a metallic absorbing material having a thickness of less than 50 nm. The optical filter comprising at least one layer of gold, titanium nitride and/or zirconium nitride.

These objectives are further achieved, in part, by providing a method for forming an optical article comprising: obtaining an optical substrate; applying at least one layer of transparent dielectric material having a refractive index above 1.6 on a surface of the optical substrate; applying at least one layer of transparent dielectric material having a refractive index less than or equal to 1.6 on the surface of the optical substrate; applying at least one layer of a metallic absorbing material on the surface of the optical substrate; and imparting a percent reflectance from a front surface of the optical article 50 percent greater than a percent reflectance from a backside of the front surface of the optical article through the applying the at least one layer of a metallic absorbing material. The applying at least one layer of a metallic absorbing material comprising applying a layer having a thickness of less than 50 nm. The applying at least one layer of a metallic absorbing material comprising applying a conductive material. The applying at least one layer of a metallic absorbing material comprising applying gold, titanium nitride and/or zirconium nitride. The obtaining an optical substrate comprising obtaining a thermoplastic ophthalmic lens.

BRIEF DESCRIPTION OF THE DRAWINGS

These and other aspects, features and advantages of which embodiments of the invention are capable of will be apparent and elucidated from the following description of embodiments of the present invention, reference being made to the accompanying drawings, in which.

DESCRIPTION OF EMBODIMENTS

Figure 1:
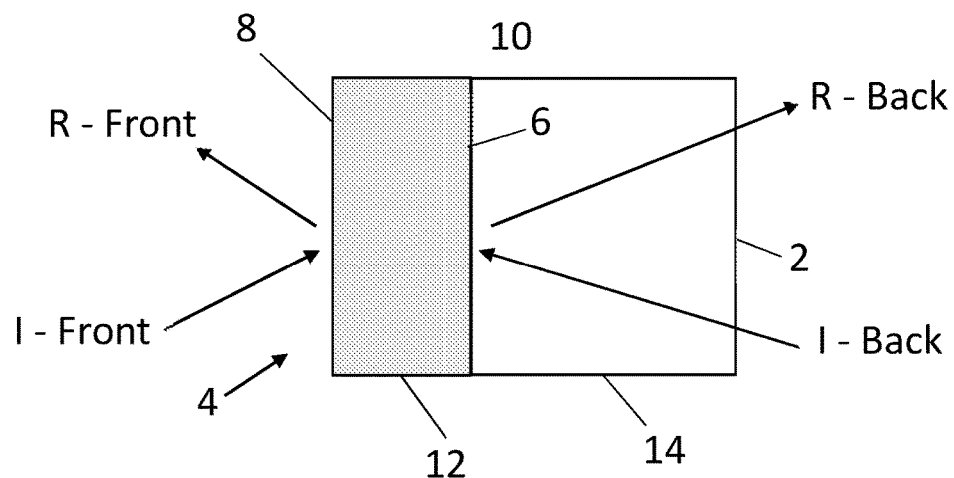
FIG. 1 is a partial cross-sectional view of an optical article according to one embodiment of the present invention.

Specific embodiments of the invention will now be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the embodiments illustrated in the accompanying drawings is not intended to be limiting of the invention. In the drawings, like numbers refer to like elements.

Broadly speaking, the present invention relates to coating designs, for example vapor deposition coatings, that provide improved control over the transmittance and the front and backside reflectance of an optical filter by providing controlled absorption through inclusion of one or more absorption layers within the coating or coating stack forming the optical filter. The present invention provides several advantages: (1) wavelength blocking can be accomplished by a combination of reflection and absorption; (2) front and backside reflectances from a coating can be influenced independently; (3) color appearance can be manipulated in order to create new mirrors or tints; and (4) enhanced Bayer or environmental performance can be provided through the use of alternate materials.

The concept of front and backside coating reflection is shown in FIG. 1. In certain embodiments, an inventive coating 12 is applied to one side of an optical substrate 14. A front side 8 of the coating 12 is the side opposite the substrate 14. A backside 6 of the coating 12 is the side in contact with the substrate 14. The front side 8 of the coating 12 may, but need not necessarily, correlate with a front side 4 of an optical article 10. Light incident on the front of the optical article 10, I-Front, can be reflected and is referred to as front side reflection, R-Front. Light incident on the backside 6 of the coating 12, I-Back, may also be reflected and is referred to as the backside coating reflection, R-Back. It is important to note the backside coating reflection, R-Back, does not originate at the backside 2 of the substrate 14 but rather at the interface of the backside 6 of the coating 12 and the substrate 14.

Certain potential performance characteristics of a filter design with absorbing layers can be understood through the concept of "Potential Transmittance", as described by MacLeod. As previously mentioned, light must be either transmitted (T), reflected (R), or absorbed (A). Often the purpose of a filter coating is to achieve a minimum in reflection, in order to maximize transmittance. If one has an existing optical filter with a given transmission and reflection, the maximum transmission that can be possibly attained by adding layers to the front and/or back of the filter is the potential transmittance ($\psi$), given by:

$$\psi = \frac{T}{(1-R)} = \frac{T}{T+A}$$

Therefore, the potential transmittance is ultimately limited by the amount of absorption present in the stack if the reflectance is eliminated. The absorption is in part dependent upon the refractive index of the absorbing layer included in the optical stack. For example, a 10 nm thick layer of tungsten on glass will have an average potential transmittance of 43 percent from 500-800 nm. In contrast a 10 nm layer of gold will have an average potential transmittance of 90 percent over the same range of 500-800 nm. These values are critical in consideration of a pass band region of a filter.

For a broad band visible filter, similar to what might be used in sunglasses a minimum potential transmittance of 8% over the visible spectrum (380 to 780 nm) would be dictated by regulatory limits for general purpose sun lenses. An upper potential transmittance limit for this broadband filter would be less than 80 percent which defines the start of light tinting for sun wear. Most common and preferred would be potential transmission levels of less than 50 percent, which is most common for sun wear. This, therefore, defines the range of the absorption to be from 20-92 percent for a broad band sun wear application, implying the reflection from the back of the lens is at or near zero maximizing the transmission. The front reflection would be substantially higher and nominally range from 20 to 80 percent.

Of more interest is the creation of edge filters to block specific spectral regions. A material such as gold can have a high maximum potential transmittance from 500-800 nm (greater than 90 percent for a thickness of 10 nm, 86 percent for a thickness of 15 nm) while having a lower potential transmittance in portions of the HEV region, for example 400-450 nm (62 percent for a thickness of 10 nm and 53 percent for a thickness of 15 nm). This difference in potential transmittance facilitates creating filters with high transmission in a pass band (for example greater than 80 percent from 500-800 nm and preferably greater than 90 percent from 500-800 nm). Simultaneously, the filter would have a stop band region with a reflection from the back of the filter lower than 20 percent, and preferably lower than 10 percent while maintaining a front filter reflection greater than 70 percent and preferably greater than 80 percent. This is possible due to the presence of the absorption in the optical filter. The design creates an asymmetry in the absorption and therefore reflection depending on which direction the light is entering the filter (from the front or the back).

Figure 2:
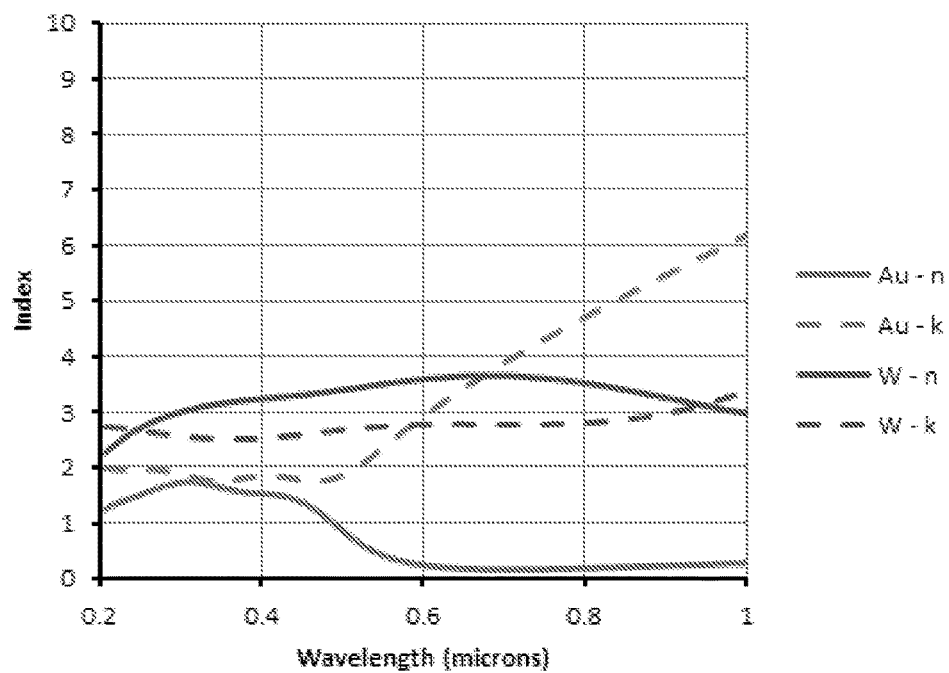
FIG. 2 is a graph comparing n and k values for tungsten and gold.

The absorbing materials employed in the present invention can be broadly grouped into two categories: (1) conductors in which the free carriers can generate absorption, e.g. metals and transparent conductive oxides, TCO, and (2) band edge absorbers, e.g. semiconductors or low band-gap insulators such as titanium dioxide, TiO$_2$. Over the near UV and visible wavelengths, metals can be broadly grouped into two categories: (1) those with low "n", refractive index, and high "k", absorptance; and (2) those with comparable n and k values. FIG. 2 shows a graph comparing n and k values for Tungsten (W) and Gold (Au), materials which represent two distinct n and k profiles.

The significance of this grouping is that metal films of the same thickness with high k/n ratio will have a much higher potential transmittance relative to metals with a lower k/n ratio. Therefore, in certain embodiments, filters and filter designs are provided which can have a high transmittance over a given spectral range and then a lower transmittance outside this range. In certain embodiments, coatings according to the present invention employ absorbers or absorbing layers that, when selectively located and formed within the coating system, allow for the creation of filters with a desired transmittance and a low reflectance. Furthermore, certain embodiments of the present invention provide for the isolation or enhancement of this effect to one side of a lens (i.e. the front and back reflectance's can be made different) and/or the creation of a reflectance on a front and a back side of the optical article or lens.

In certain embodiments, the design approach of the present invention is, in part, dependent on the choice of absorbing materials. For example, metals with a high k/n ratio, e.g. aluminum, silver, gold, allow high potential transmittance while lower k/n ratio materials allow a lower potential transmittance but are more neutral in appearance.

In certain embodiments, an absorbing layer is incorporated into a coating stack to reduce both the front and back reflection while maintaining a low transmission in a select band, i.e. a blocking or rejection band. For example, by absorbing HEV wavelengths the reflected color, typically violet for HEV blocking, is altered to be aesthetically more appealing while maintaining the desired protection.

In certain embodiments, selective blocking filters, such as for filtering HEV wavelengths, are provided in which an absorber is incorporated into a coating stack in order to achieve high reflectance below a cutoff wavelength from the front surface, a significantly reduced back reflectance below a cutoff wavelength from the eye side of the lens, and high transmittance through the visible wavelengths.

In certain embodiments of the present invention, a filter is formed, in part, of one or more layers of absorbing material interposed within alternating layers of one or more materials selected from, but not limited to, materials including: silicon dioxide, silicon oxynitride, aluminum oxide, titanium dioxide, tantalum pentoxide, and zirconium dioxide. In certain embodiments, a layer of absorbing material is interposed directly between a layer of high refractive index material and a layer of low refractive index material. In certain other embodiments, a layer of absorbing material is directly interposed within an otherwise single, contiguous layer of high or low refractive index material.

In certain embodiments of the present invention, optical filters and optical articles formed thereof are provided (1) that have an average transmission for light having wavelengths in the range of 500-800 nm of greater than 70 percent, for example, in the range of approximately 70 to 99 percent, 80 to 99 percent, 90-99 percent; (2) that have a backside reflectance of the coating forming the filter for light having wavelengths in the range of 400-450 nm of less than 40 percent, less than 30 percent, less than 10 percent, or less than 2 percent or in the range of approximately 5-65 percent; (3) that have a front side reflectance for light having wavelengths in the range of 400-450 nm of in the range of approximately 50-90 percent or 75-90 percent.

In certain embodiments of the present invention, optical filters and optical articles formed thereof are provided that have a difference between the backside reflectance of the coating and the front side reflectance of the coating and/or optical article employing the coating above 50 percent or in the range of approximately 30-85 percent.

Figure 3A:
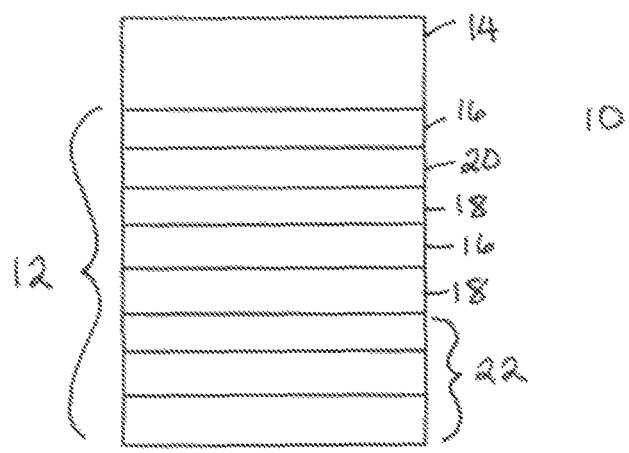
FIG. 3A is a partial cross-sectional view of an optical filter according to one embodiment of the present invention.
Figure 3B:
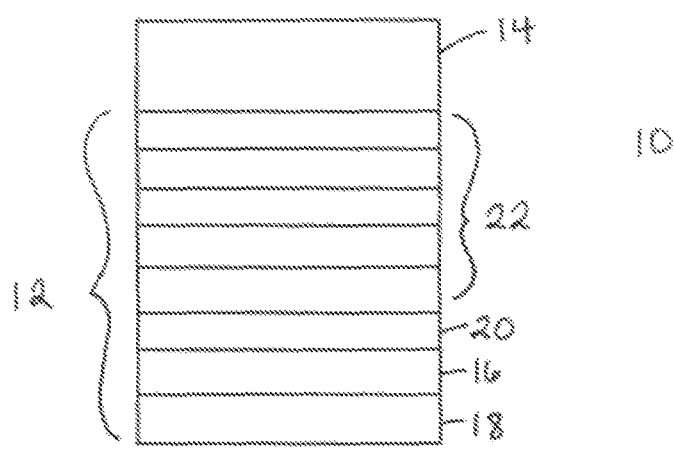
FIG. 3B is a partial cross-sectional view of an optical filter according to one embodiment of the present invention.
Figure 3C:
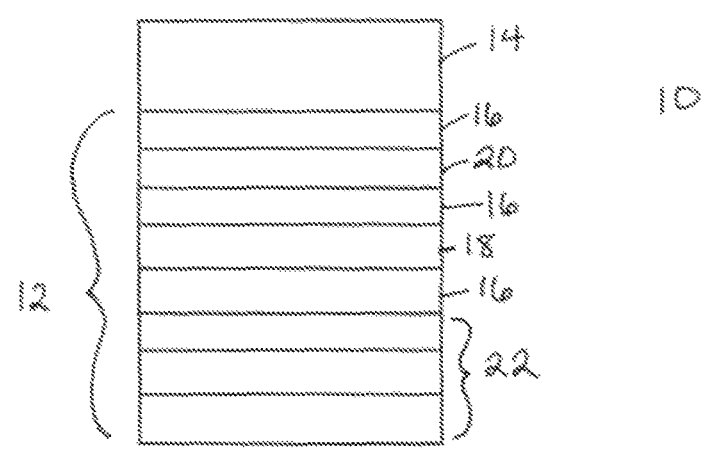
FIG. 3C is a partial cross-sectional view of an optical filter according to one embodiment of the present invention.

As shown in FIGS. 3A-3C, according to certain embodiments, a lens or optical article 10 has a coating 12, i.e. has an optical filter stack. For the sake of clarity, the coatings or stacks disclosed herein will be described from the bottom up. That is to say, the various layers forming the coating or stack will be described starting from a first or bottom layer of the stack that is applied directly to an optical substrate and proceeding sequentially with each subsequent layer of the stack applied. In this manner, a "top layer" of the coating or stack is the last layer of the relevant coating or stack applied during the coating process.

In the embodiment shown in FIG. 3A, a first high refractive index layer 16 is applied directly on top of an optical substrate 14. A metallic absorbing layer 20 is applied directly on top of the first high refractive index layer 16. A first low refractive index layer 18 is applied directly on top of the absorbing layer 20. A second high refractive index layer 16 is applied directly on top of the first low refractive index layer 18, and a second low refractive index layer 18 is applied directly on top of the second high refractive index layer 16. Additional alternating layers 22 of high refractive index material and low refractive index material are therein applied as desired or required to obtain the target optical characteristics.

In the embodiment shown in FIG. 3B, the alternating layers 22 of high refractive index material and low refractive index material are applied directly on top of the optical substrate 14. The metallic absorbing layer 20 is applied directly on top of the alternating layers 22. A high refractive index layer 16 is applied directly on top of the metallic absorbing layer 20, and a low refractive index layer 18 is applied directly on top of the high refractive index layer 16. In comparison to the embodiment shown in FIG. 1, the coating 12 shown in FIG. 2 employs the metallic absorbing layer 20 closer to a top of the coating, i.e. toward a front surface or front side of the coating 12.

In the embodiment shown in FIG. 3C, a metallic absorbing layer 20 is applied directly within a first high refractive index layer 16 that is applied directly on top of an optical substrate 14. A first low refractive index layer 18 is applied directly on top of the first high refractive index layer 16. A second high refractive index layer 16 is applied directly on top of the first low refractive index layer 18, and additional alternating layers 22 of high refractive index material and low refractive index material are therein applied as desired or required to obtain the target optical characteristics. In the embodiment shown in FIG. 3, the metallic absorbing layer 20 is directly interposed within the otherwise single, contiguous high refractive index layer 16.

By way of example, in the embodiments shown in FIGS. 3A-3C, metallic absorbing layer 20 is, for example, formed of gold, tungsten, nickel, or zirconium and has a thickness of 2 to 20 nanometers, for example 4 or 15 nanometers. The thickness depends upon the absorbing metal used and the desired spectrum from the filter coating. The high refractive index layer 16 is, for example, formed of zirconium dioxide and has a thickness of approximately 5 to 15 nanometers, for example, 13 nanometers or a thickness of approximately 100 to 150 nanometers, for example, 121.5 nanometers, depending on the location of the layer 16 within the coating 12. The low refractive index layer 18 is, for example, formed of silicon dioxide and has a thickness of approximately 20 to 40 nanometers, for example, 30.2 nanometers or a thickness of approximately 100 to 150 nanometers, for example, 121.5 nanometers, also, depending on the location of the layer 18 within the coating 12.

In certain embodiments of the present invention, the inventive coating employs, but need not necessarily employ, an adhesive layer applied directly to a surface of an optical substrate 14. The adhesive layer is, for example, formed of a silicon oxide, $SiO_x$ where x is less than or equal to two; zirconium; and/or a zirconium oxide, $ZrO_x$ where x is less than or equal to two and has, for example, a thickness of approximately 1 nanometer or less.

It will be appreciated that the above-described coating stacks 12 are only examples of coatings according to the present invention and that variations in the number of the layers, the individual thickness of the different layers, and the various materials from which the different layers are formed are contemplated and within the scope of the present invention. Furthermore, the lens 10 may further employ additional functional coatings and treatments applied over or on top of the coating 12, for example, easy-cleaning and/or hydrophobic coatings.

In certain embodiments, a separate hydrophobic or anti-fouling layer or coating may be applied on top of the above-described alternating layers of low, mid, and high refractive index materials. This hydrophobic or anti-fouling layer or coating provides for easier cleaning and maintenance of the ophthalmic lens. For sputter applied films, a hydrophobic or anti-fouling layer or coating is typically applied by a dip process which achieves a low surface energy on the coating, i.e. achieves a water contact angle greater than 100 degrees. Such hydrophobic or anti-fouling layers or coatings have a thickness in the range of approximately five to ten nanometers.

In one embodiment of a coating method according to the present invention, a plastic lens is coated using a sputter tool designed with a small footprint suitable for use in a small prescription processing lab. Aspects of such a sputter system are detailed in the Assignee's U.S. Publication No. 2014/0174912 which is herein incorporated by reference in its entirety. The relatively small footprint of such a machine limits the number of sputter targets, or materials, to a maximum of two. The targets are formed of metallic-type materials and oxygen, nitrogen, and/or argon are added during processing to form the desired transparent dielectric layers of low and high refractive index oxide materials. One target is used to form a low index material, such as silicon dioxide, from a silicon target exposed to oxygen gas. The other target is used to form a high index material, such as zirconium dioxide, from a zirconium target exposed to oxygen gas. A plasma source in the system provides an activated oxygen plasma to assist in the formation of the absorption free oxide layers.

The use of Zr and/or Ti as the target material for the transparent oxide is beneficial as it provides the ability to alternatively form ZrN and/or TiN by the addition of nitrogen instead of oxygen. These conductive ceramics provide the benefit of the desired refractive index profile, similar to Au, at substantially lower cost.

By way of example, at the start of the sputter process, the lens to be coated is transferred into the coating chamber. At a chosen pressure, typically below $5 \times 10^{-5}$ mbar a mixture of argon, and oxygen are passed into the chamber by mass flow controllers. The plasma source is energized to form a plasma in order to treat the lens surface increasing the adhesion of deposited film material to the lens. Following plasma cleaning, an adhesion layer of silicon may alternatively be deposited at an argon flow of 40 standard cubic centimeters per minute, SCCM, and a power of 1500 watts. No oxygen is added into the process which allows the formation of a silicon film with minimal oxygen incorporation. The thickness of this layer is set by the deposition time. Typically, a film thickness of less than one nanometer is deposited. If a layer thickness of three nanometers or greater is deposited the film is sufficiently conductive to impart antistatic properties. On top of this layer, alternating layers of low and high index material and one or more metallic absorbing layers are deposited to prescribed thicknesses using a suitable process such as pulsed direct current reactive sputtering.

Such material layers are deposited at powers sufficient to achieve the desired cycle time while not causing unwanted heating of the lens. A typical power level is 1458 watts for a target approximately six inches in diameter. For the silicon dioxide film formation from a silicon target, 16 SCCM of oxygen is added to the plasma source running a discharge current of 300 milliamps at a voltage of near 250. Argon is supplied to the sputter head at a flow rate of 10 SCCM. The result is a high quality transparent silicon dioxide film using a process compatible with most plastic lenses. For the zirconium dioxide film formation from a zirconium target, 20 SCCM of oxygen is added to the plasma source running a discharge current of 300 milliamps at a voltage of near 250. Argon is supplied to the sputter head at a flow rate of 20 SCCM. The result is a high quality transparent zirconium dioxide film formed from a process compatible with most plastic lenses.

Absorbing layers may be formed in several ways. By removing the oxygen from a deposition process the deposited film becomes the associated metal, such as Zr from a Zirconium target. Alternatively, nitrogen may be added to the process to form, for example, ZrN. A typical power level is 1458 watts for a target approximately six inches in diameter. The sputter gas, most commonly Ar, is supplied to the target and Nitrogen supplied either at the target or through the plasma source. Typical nitrogen flow rates are 2-10 SCCM.

The individual layer thicknesses are set by the coating design, as understood by anyone skilled in the art. These thicknesses will vary depending upon the desired design and the number of layers may vary, typically between four and seven, with the total coating thickness of between 200 and 500 nanometers. The process conditions described above provide an example for reference only and may vary depending upon the materials employed, the desired film properties, and the coating machine employed.

In certain embodiments, the coating system of the present invention is formed and optimized for specific applications by manipulating the deposition conditions employed in forming the coating system. For example, deposition conditions of each of the different target materials is varied to achieve the desired reflectance, transmission, absorbance, and anti-static properties of the resulting coating system.

It will be appreciated that deposition conditions or parameters are numerous for different sputtering techniques and machines, and meaningful deposition parameters and/or figures can often only be supplied for one given deposition system or machine. Accordingly, for any given system, a skilled operator will appreciate that it will be necessary to determine the variation of the desired properties of a coating as a function of the specific deposition conditions of the deposition machine employed. The system parameters that may alter from one machine to the next include: the geometry of the deposition chamber, the target size, the power applied to the target, the target voltage, the distance between the substrate and the target, the target composition, gas flow-rates, pumping speed, total pressures, and the like.

In certain embodiments, coatings according to the present invention are applied to optical substrates and articles, for example, ophthalmic lenses, optical laminates, windows, safety goggles, shields, and sun glasses. The coating system of the present invention is applied to a front, a back or a front and back surface of the optical article. The ophthalmic lenses may, for example, be a finished or unfinished lens and/or a single or multifocal lens. The optical article can, for example, be formed of glass, crystalline quartz, fused silica, or soda-lime silicate glass. In an alternative embodiment, the optical article is formed of a thermoplastic bulk material or resin suitable for injection molding or from curable compositions, for example a composition employing a liquid monomer mixture or a urethane based prepolymer composition. Such materials include, but are not limited to, polymers based on allyl diglycol carbonate monomers (e.g. CR-39 available from PPG Industries, Inc. and SPECTRALITE and FINALITE Sola International Inc.), urethane based prepolymer compositions (e.g. Trivex, PPG) and polycarbonates (e.g. LEXAN available from General Electric Co.).

Such optical articles may be transparent or may employ an active or static coloring substrate. Such optical articles may further employ additional functional characteristics in the form of coatings, monolithic film inserts, and/or thin film laminates or wafers. The functional attributes of such films, laminates, or coatings may include, for example, coloration, tinting, hard coating, polarization, photochromism, electrochromism, UV absorption, narrow band filtering, anti-static, anti-crazing, and easy-cleaning.

EXAMPLES

Coating Simulations

Figures 4A, 4B:
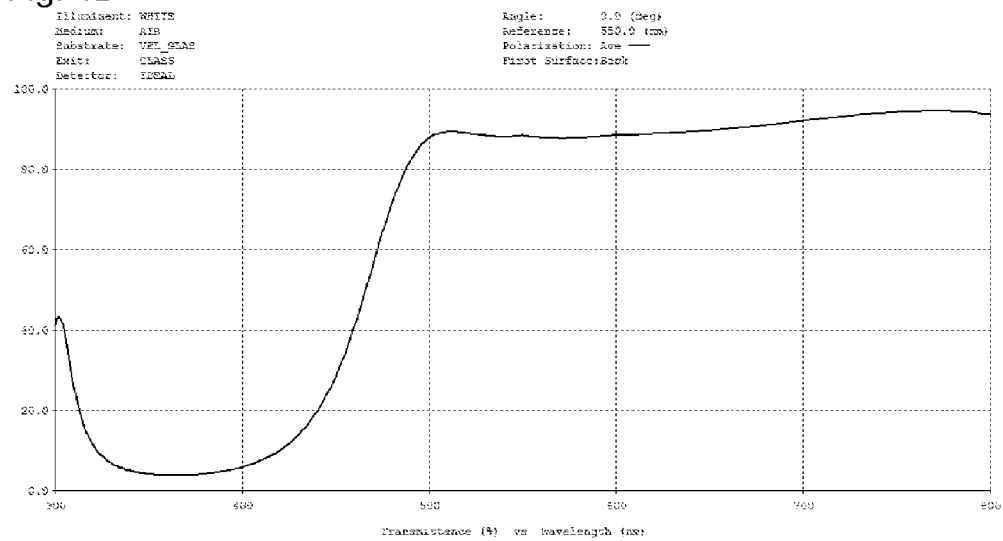
FIG. 4A is a table showing the configuration of an optical filter according to one embodiment of the present invention.
FIG. 4B is a graph showing the transmittance of an optical filter according to one embodiment of the present invention.
Figure 4C:
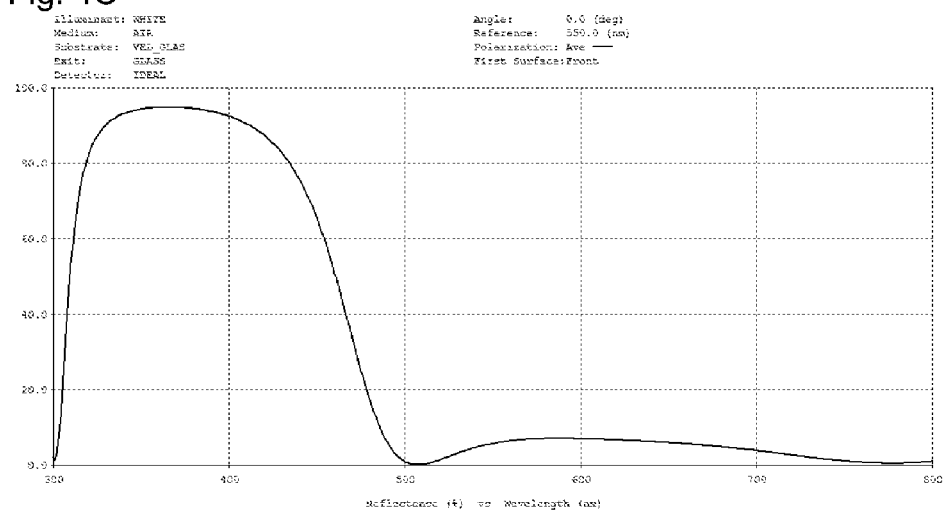
FIG. 4C is a graph showing the front side reflectance of an optical filter according to one embodiment of the present invention.
Figure 4D:
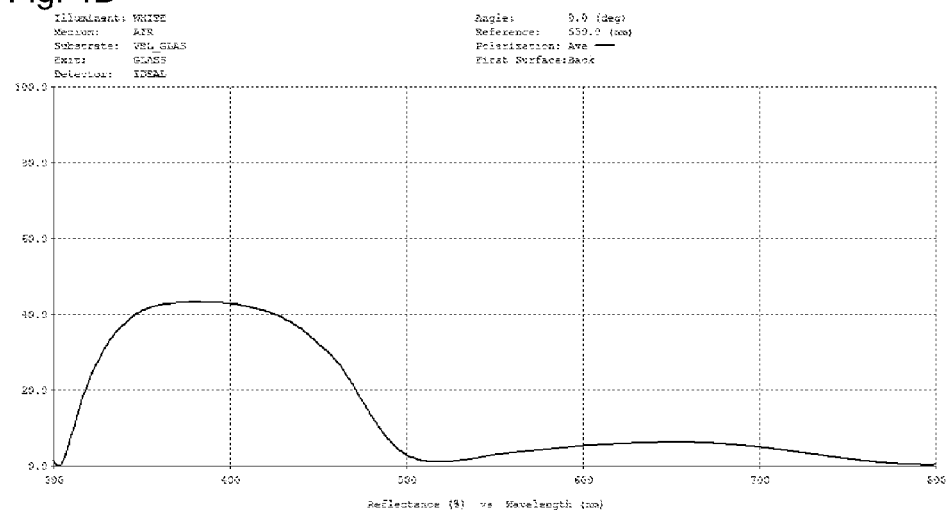
FIG. 4D is a graph showing the backside reflectance of an optical filter according to one embodiment of the present invention.

Sample filter designs were created in TFCalc (Software Spectra, Inc.) for filters using tungsten, W, and gold, Au, metallic absorbing layers. W has a low k/n ratio and Au has a high k/n ratio past 500 nm. Each filter was optimized to achieve the maximum transmission from 500-800 nm with a back reflectance of the filter, Rb, of near 40 percent around 400 nm. The front reflectance of the filter, Rf, was maximized in this simulation. FIG. 4A is a table showing the configuration of a coating stack employing a layer of absorbing Au separated from the substrate by a layer of titanium dioxide. FIG. 4B shows the transmittance of the same coating; FIG. 4C shows the front side reflectance of the same coating; and FIG. 4D shows the backside reflectance of the same coating.

Figures 5A, 5B:
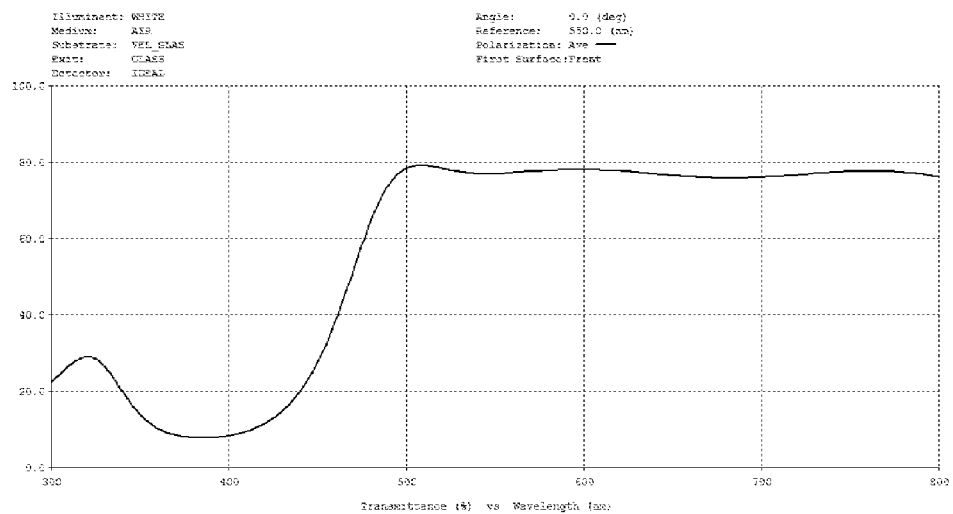
FIG. 5A is a table showing the configuration of an optical filter according to one embodiment of the present invention.
FIG. 5B is a graph showing the transmittance of an optical filter according to one embodiment of the present invention.
Figure 5C:
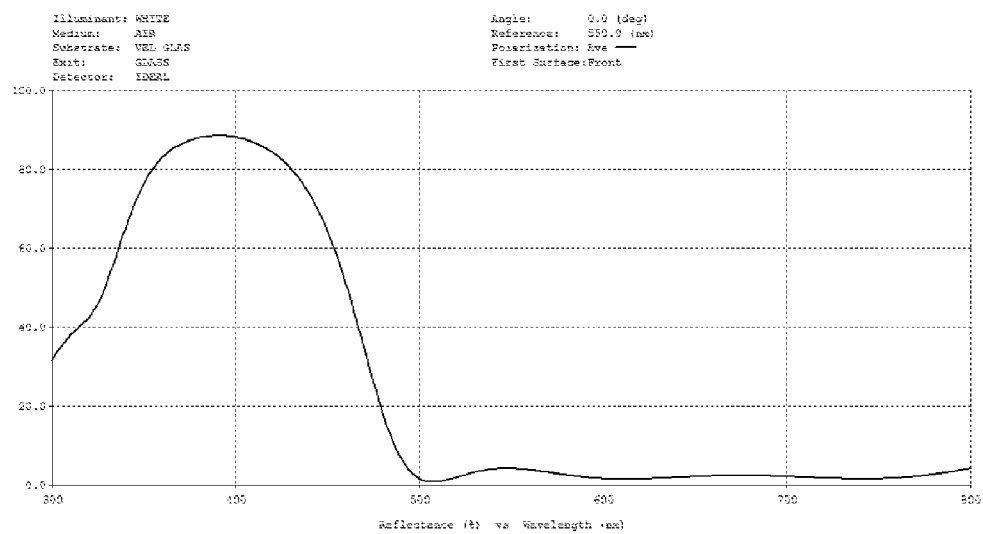
FIG. 5C is a graph showing the front side reflectance of an optical filter according to one embodiment of the present invention.
Figure 5D:
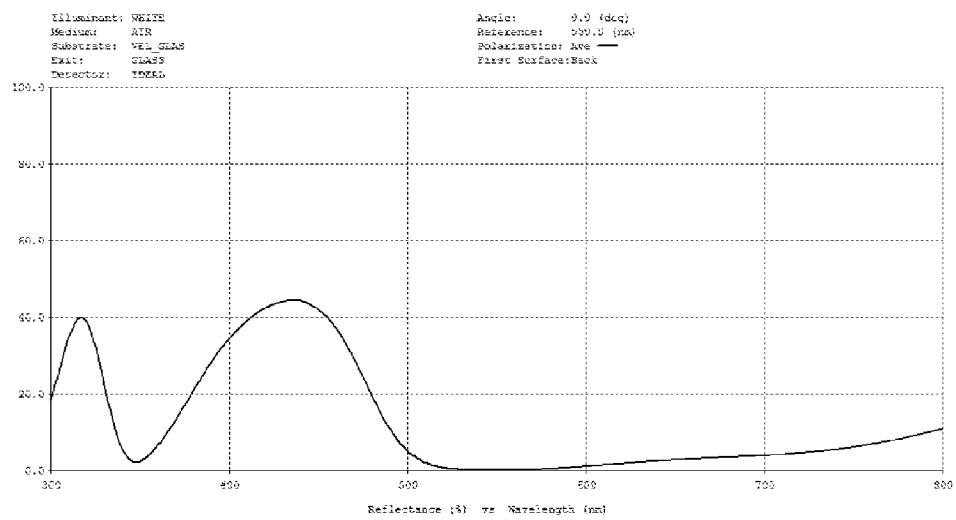
FIG. 5D is a graph showing the backside reflectance of an optical filter according to one embodiment of the present invention.

FIG. 5A is a table showing the configuration of a coating stack employing an absorbing layer of W separated from the substrate by a layer of titanium dioxide. FIG. 5B shows the transmittance of the same coating; FIG. 5C shows the front side reflectance of the same coating; and FIG. 5D shows the backside reflectance of the same coating.

This simulation substantiates several design goals of the present invention. First, according to the filter design of the present invention, front and back reflectance's can be decoupled, or independently and selectively optimized and controlled. Hence, in certain embodiments of the present invention, for example for application with ophthalmic lenses, the reflectance from the back (wearer) side of the lens is designed to be different from the reflectance from the front, opposite side, of the lens. The results shown in at least FIGS. 4C and 4D and 5C and 5D show that the effect is significant when blocking UV and/or blue light. In the specific case of a night-driver lens, this advantage is emphasized even more since reflection off the back of the lens from cars passing a driver can be significantly distracting. Filters according to the present invention allow for the high front side reflection to be maintained while substantially lowering the back surface reflection.

Second, according to the filter designs of the present invention, the transmission in the pass band of the coating can be manipulated or optimized by employing absorbing layers formed of different materials. For example, in the above described simulations, transmission in the pass band of the coating employing a Au layer is much higher than the pass band of the coating employing the W layer. This is true even though the W layer is half the thickness of the Au layer.

Figure 6A:
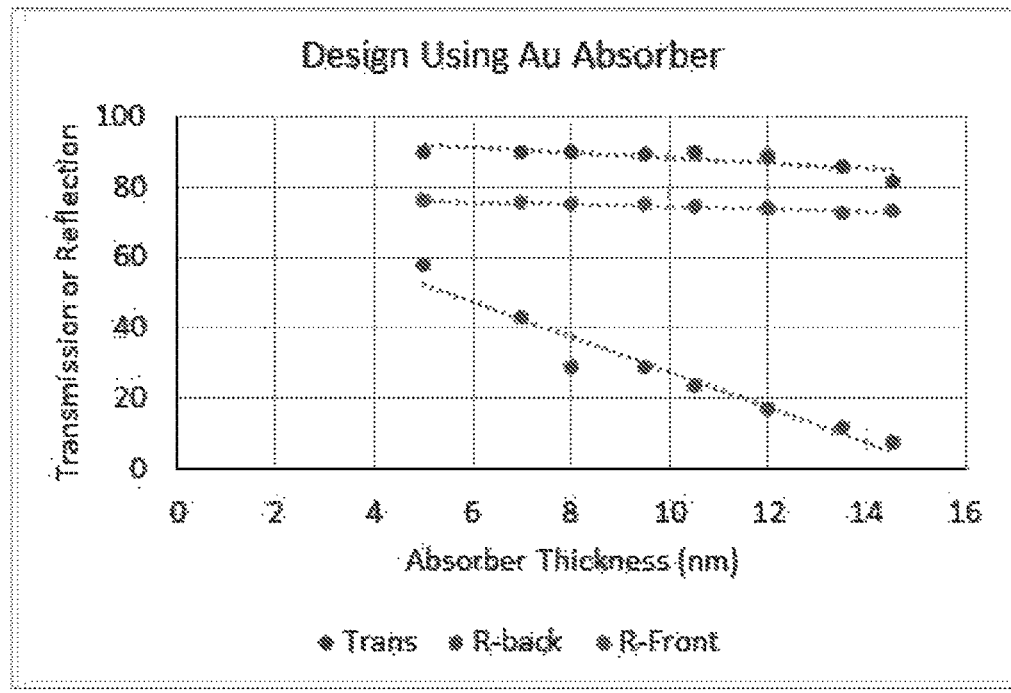
FIG. 6A is a graph showing the transmittance, front side reflectance, and backside reflectance of an optical filter according to one embodiment of the present invention.
Figure 6B:
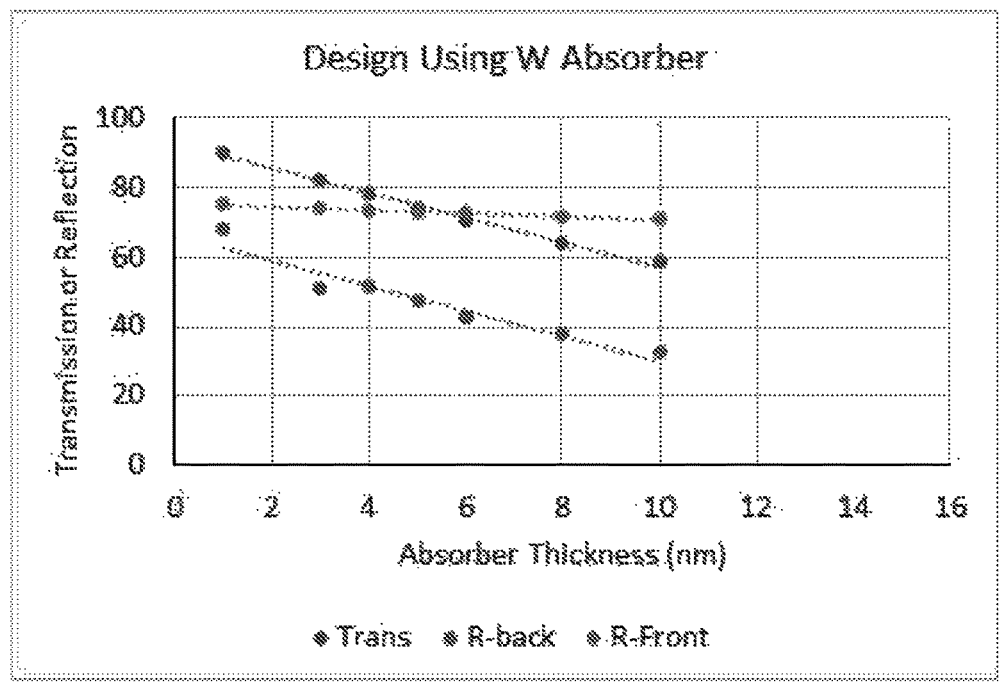
FIG. 6B is a graph showing the transmittance, front side reflectance, and backside reflectance of an optical filter according to one embodiment of the present invention.

Additional simulations were performed to further evaluate the effect of manipulating the thicknesses of the W and Au layers used in the coating stacks to achieve a range of back surface reflections while maximizing the transmission above the desired HEV cut-off. FIGS. 6A and 6B show the percent transmittance, Trans (line starting top left), back surface reflections, R-Back (line starting bottom left), and front surface reflections, R-Front (line starting middle left), of these simulations. The reported transmission is the average value from 500-800 nm. The reported reflection (either front or back) is the average from 400-450 nm. The data clearly shows the benefit of employing a material with a refractive index profile such as Au. For a given back reflection below the cut off, the average visible transmission can be maintained at a much higher value when compared to a metal such as W, tungsten.

Other metal absorbers that may be employed in the present invention include silver, Ag, which is commonly used in Low-E window coatings for its ability to achieve high transmission throughout the visible spectrum. In such Low-E applications, the reflectances are near equal from the front and back of the coating design. For the specific application of blue light blocking, according to the present invention, Au is unique compared to other metals due to its transition from low-to-high k and high-to-low n occurring in the blue wavelength band. This provides the unique color of gold. Other conductors have a similar appearance are titanium nitride, TiN, and zirconium nitride, ZrN. These conductive ceramics both have an appearance similar to gold. Their refractive indices have been studied by several researchers and found to mimic that of gold. An example for TiN is provided by Panos Patsalas, Nikolaos Kalfagiannis, and Spyros Kassavetis; Materials 2015, 8, 3128-3154; doi: 10.3390/ma8063128 (2015), which is incorporated herein in its entirety, which shows the complex refractive index of TiN is very close to that of Au. Therefore, similar performance can be expected for TiN in an optical filter when substituted for gold. An advantage of employing TiN is its relatively low cost. Also, it can be formed from the same target used to form $TiO_2$. Furthermore, noble metals such as gold pose difficulties for adhesion due to their general non-reactivity with other species.

Figures 7A, 7B:
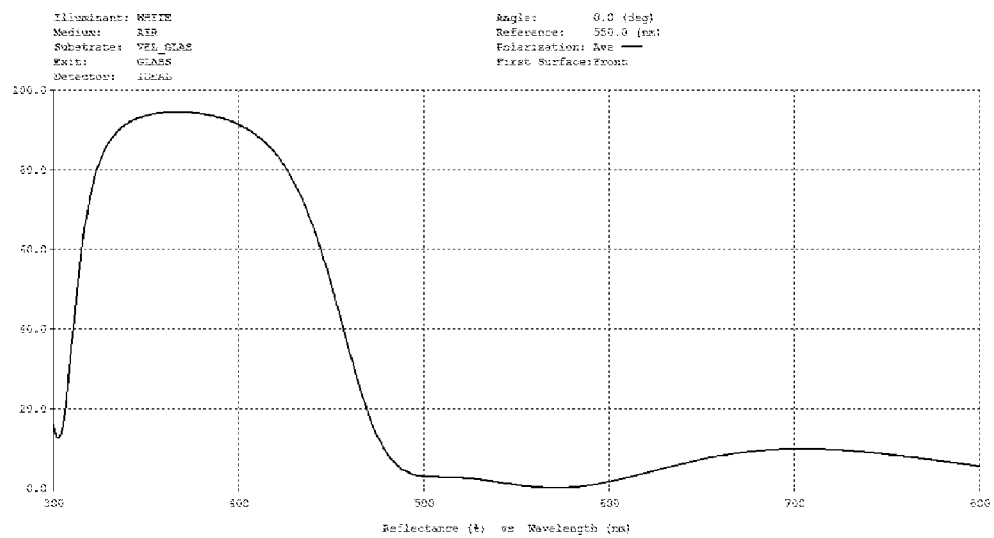
FIG. 7A is a table showing the configuration of an optical filter according to one embodiment of the present invention.
FIG. 7B is a graph showing the front side reflectance of an optical filter according to one embodiment of the present invention.
Figures 7C, 8A:
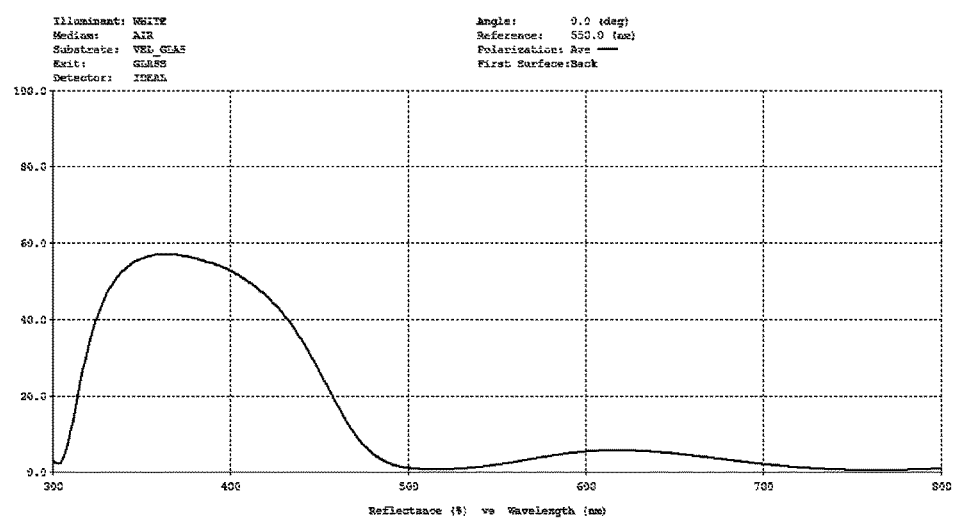
FIG. 7C is a graph showing the backside reflectance of an optical filter according to one embodiment of the present invention.
FIG. 8A is a table showing the configuration of an optical filter according to one embodiment of the present invention.
Figure 8B:
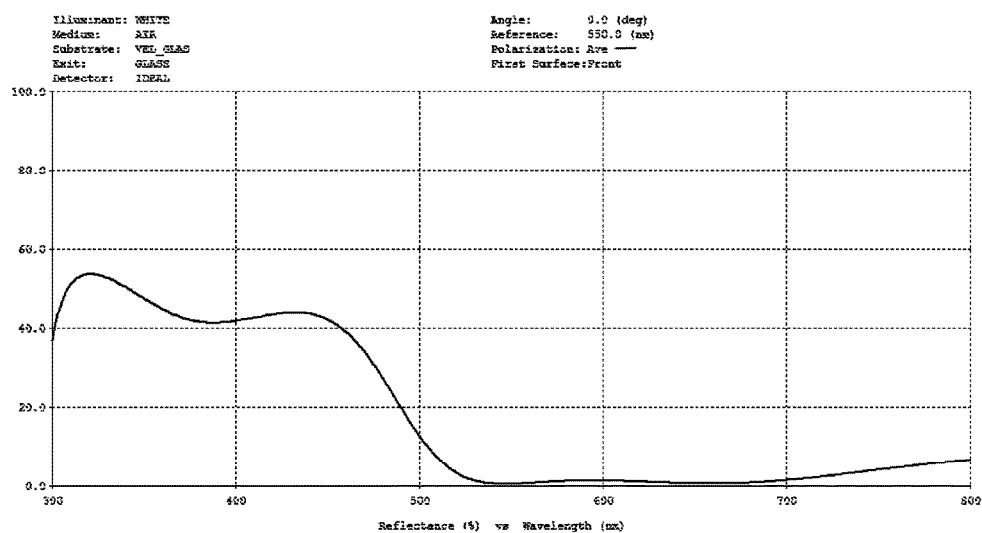
FIG. 8B is a graph showing the front side reflectance of an optical filter according to one embodiment of the present invention.
Figure 8C:
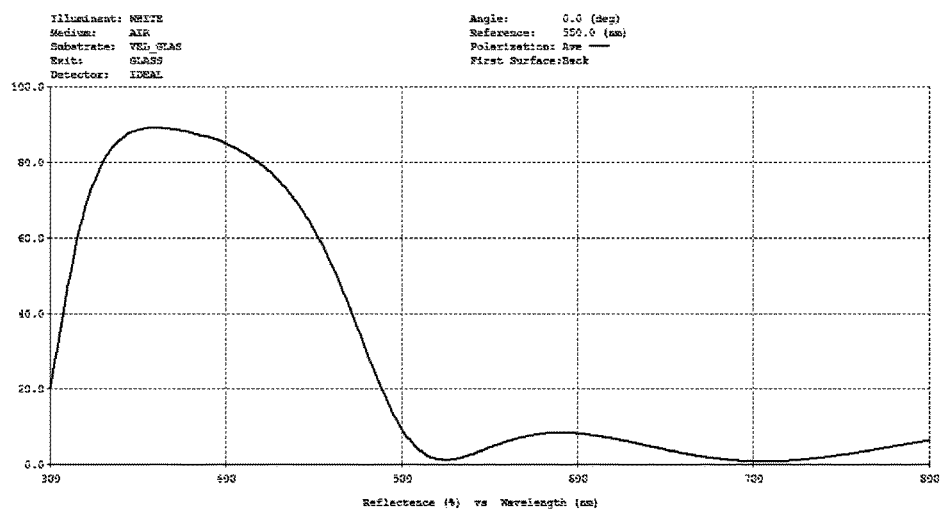
FIG. 8C is a graph showing the backside reflectance of an optical filter according to one embodiment of the present invention.

Two additional filter designs according to the present invention were simulated using nickel, Ni, as the metallic absorbing layer. The index profile of Ni is similar to W. The purpose of this simulation was to show the effect that moving the absorbing layer to different positions within the stack will have on the front and back reflectance. In both cases the stacks were re-optimized as described above. FIG. 7A is a table showing the configuration of a coating stack employing a layer of Ni separated from the substrate by a layer of titanium dioxide. FIG. 7B shows the front side reflectance of the same coating, and FIG. 7C shows the backside reflectance of the same coating. FIG. 8A is a table showing the configuration of a coating stack employing a layer of Ni separated from the substrate by six alternating layers of titanium dioxide and silicon dioxide. FIG. 8B shows the front side reflectance of the same coating, and FIG. 8C shows the backside reflectance of the same coating. The results show how front and back reflectances of a filter of the present invention can be optimized by the selective positioning of the absorbing layer, e.g. an Ni layer, within the stack.

Coating Examples

In one example, zirconium, Zr, metal was used to form an absorbing material layer in a coating according to the present invention. The index profile of Zr is expected to be similar to Ni (i.e. low k/n value). Therefore, Ni was used from the refractiveindex.info database. The Zr layer thickness was controlled based on time. Hence, the exact thickness of the Zr layer is unknown due to variations in the oxidation state of the target before each deposition. All coatings were performed on glass slides. The spectral data of the experimental samples produced was obtained from a Hunter spectrometer.

Figures 9A, 9B:
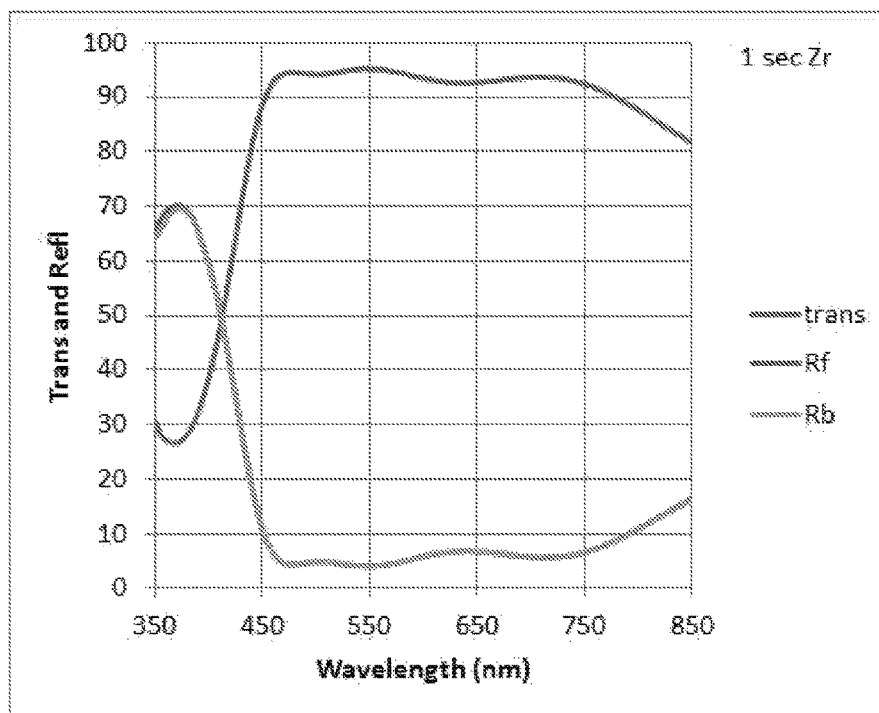
FIG. 9A is a table showing the configuration of an optical filter according to one embodiment of the present invention.
FIG. 9B is a graph showing the transmittance, front side reflectance, and backside reflectance of an optical filter according to one embodiment of the present invention.
Figure 9C:
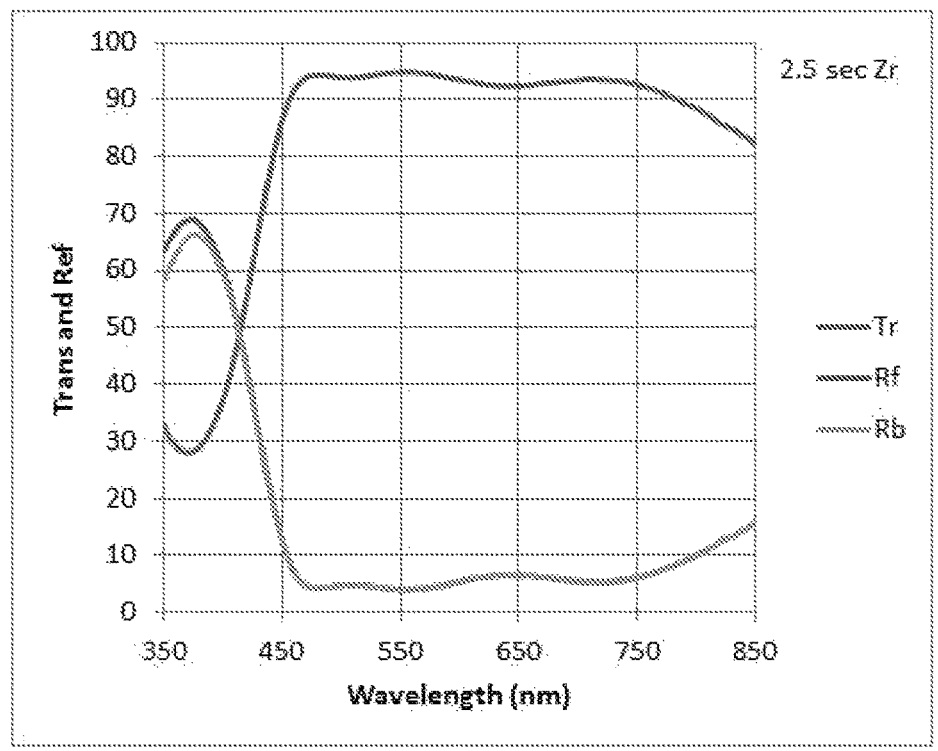
FIG. 9C is a graph showing the transmittance, front side reflectance, and backside reflectance of an optical filter according to one embodiment of the present invention.
Figure 9D:
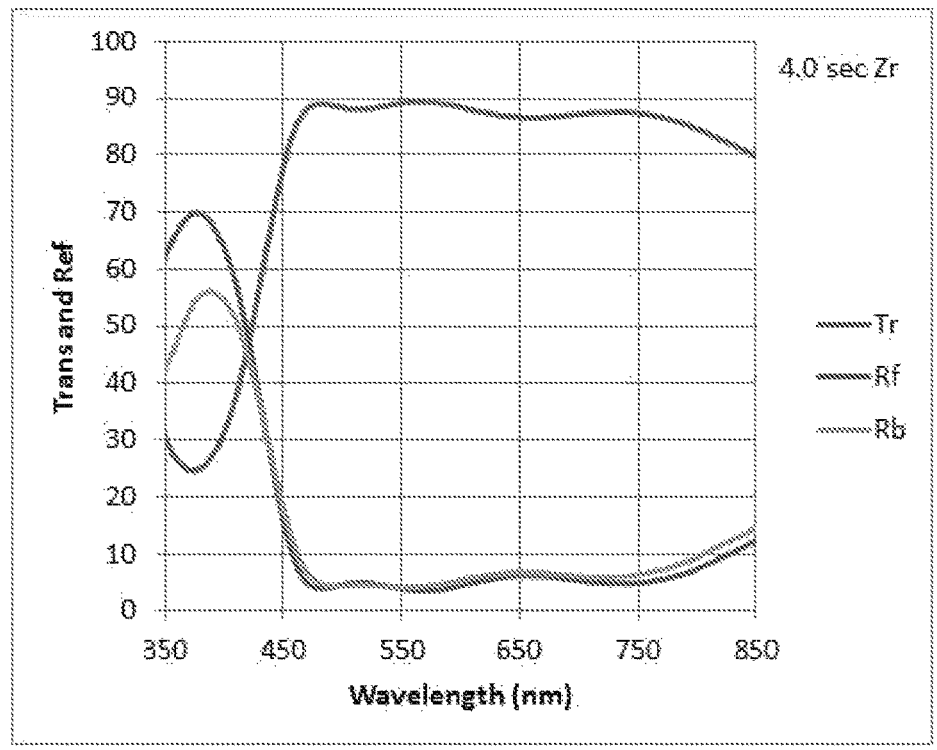
FIG. 9D is a graph showing the transmittance, front side reflectance, and backside reflectance of an optical filter according to one embodiment of the present invention.
Figure 9E:
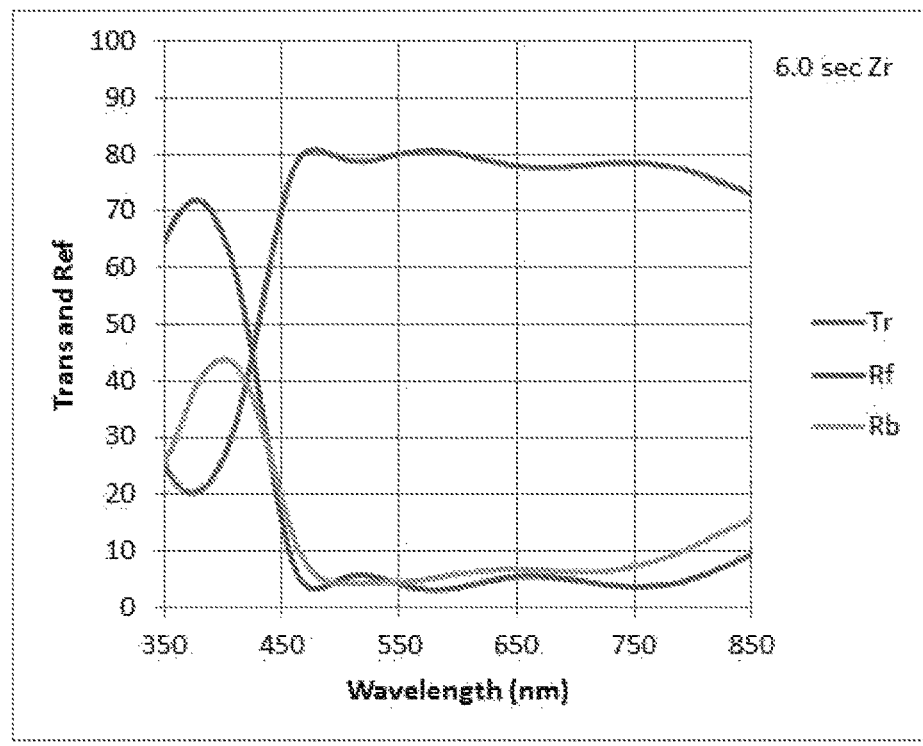
FIG. 9E is a graph showing the transmittance, front side reflectance, and backside reflectance of an optical filter according to one embodiment of the present invention.
Figure 9F:
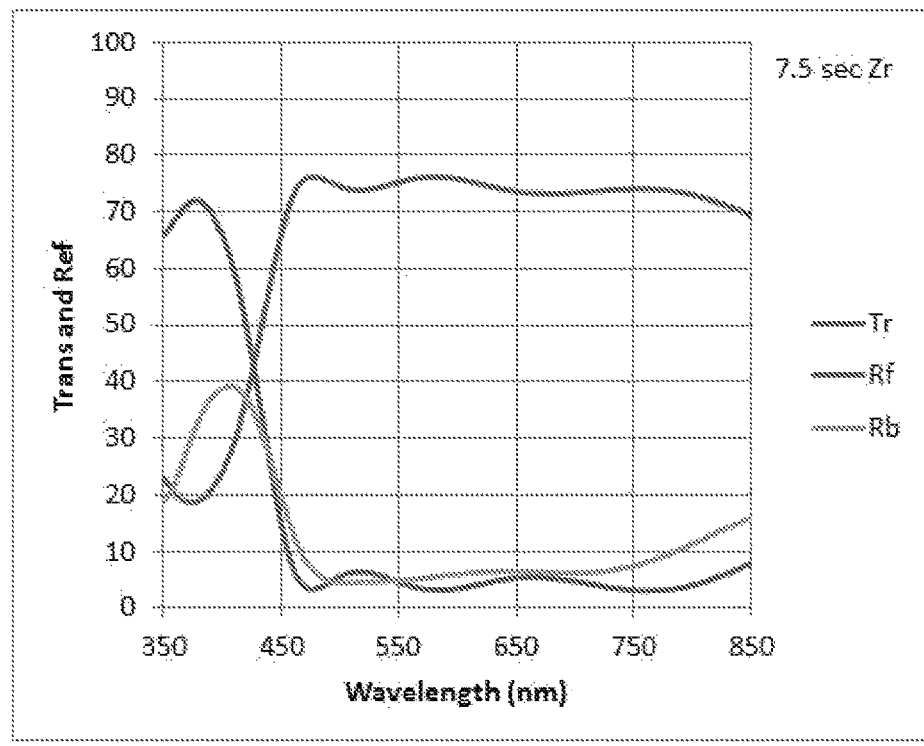
FIG. 9F is a graph showing the transmittance, front side reflectance, and backside reflectance of an optical filter according to one embodiment of the present invention.
Figure 9G:
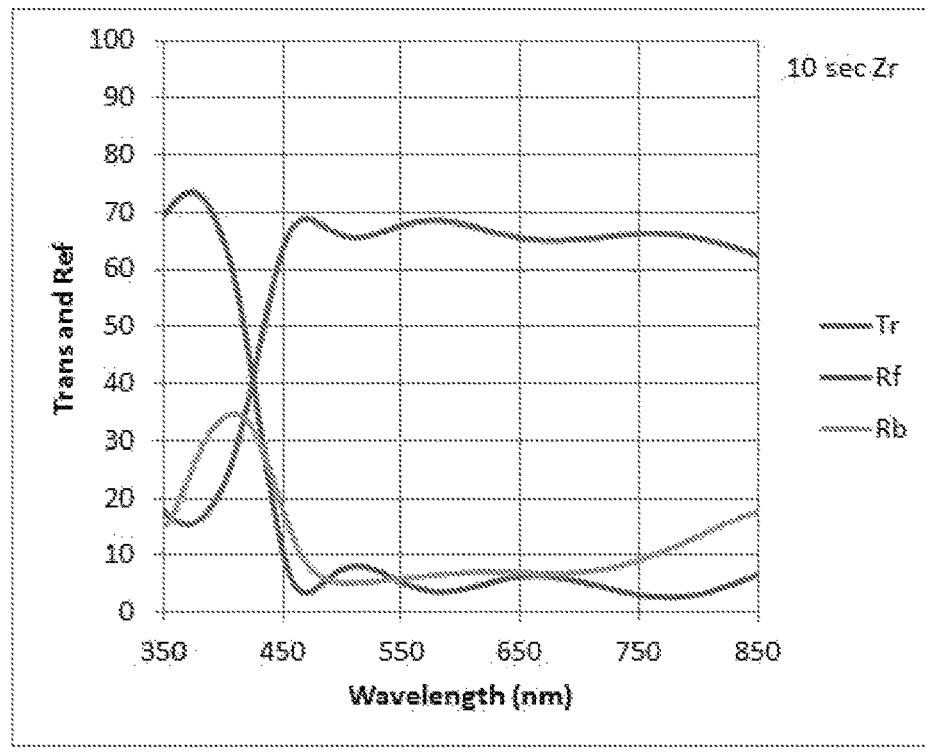
FIG. 9G is a graph showing the transmittance, front side reflectance, and backside reflectance of an optical filter according to one embodiment of the present invention.
Figure 9H:
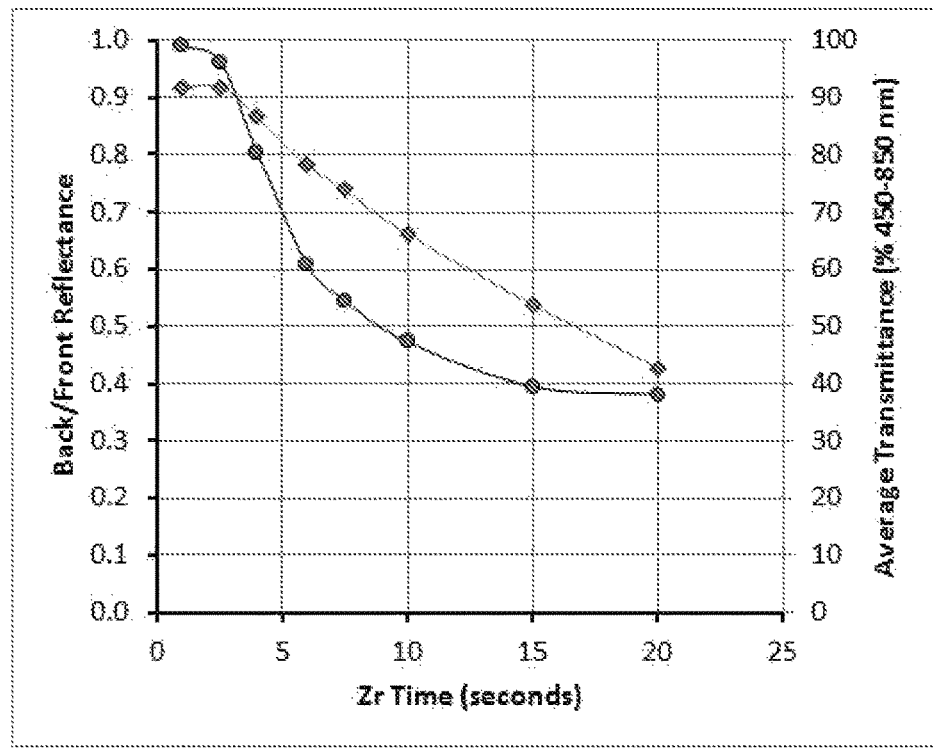
FIG. 9H is a graph showing the transmittance, front side reflectance, and backside reflectance of optical filters according to certain embodiments of the present invention.

FIG. 9A is a table showing the configuration of a coating stack employing a layer of absorbing Zr separated from the substrate by a layer of zirconium dioxide. FIG. 9B shows the percent transmittance (trans), front side reflectance (Rf), and backside reflectance (Rb) for a coating employing a Zr layer formed over 1 second. FIGS. 9C, 9D, 9E, 9F, and 9G shows the transmittance, front side reflectance, and backside reflectance for coatings employing a Zr layer formed over 2.5, 4, 6, 7.5, and 10 seconds, respectively. Of primary interest for an application like optical lenses for driving at night is the reduction of back surface reflection, Rb. FIG. 9H shows the ratio of the peak backside reflectance to peak front side reflectance (circles) and the average percent transmittance of wavelengths from 450-850 (diamonds) generated from the test coatings shown in FIGS. 9B through 9G.

The above demonstrates that the use of a selectively positioned and formed absorbing layer according to the present invention is operable to reduce the back surface reflection by 30 percent relative to the front while still maintaining a transmittance near 80%. Additional optimization of the filter of the present invention can reduce the reflectance in the visible wavelengths which will increase the overall transmittance.

Figures 10A, 10B:
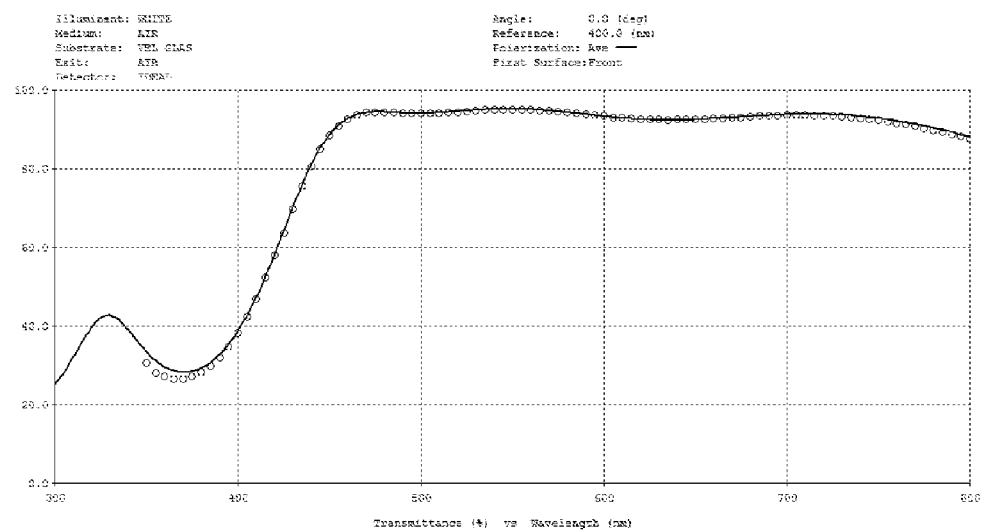
FIG. 10A is a table showing the configuration of an optical filter according to one embodiment of the present invention.
FIG. 10B is a graph showing the transmittance of an optical filter according to one embodiment of the present invention.
Figure 10C:
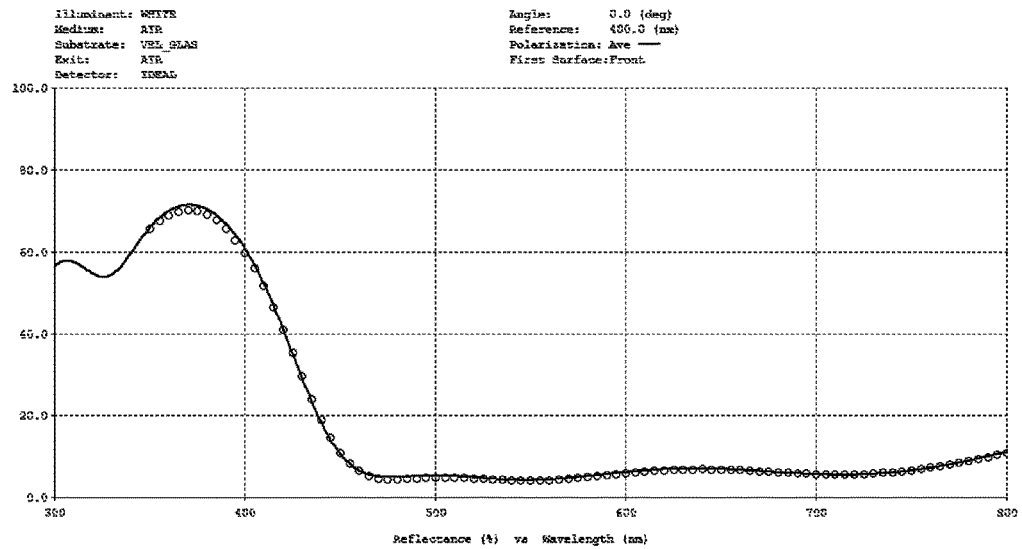
FIG. 10C is a graph showing the front side reflectance of an optical filter according to one embodiment of the present invention.
Figure 10D:
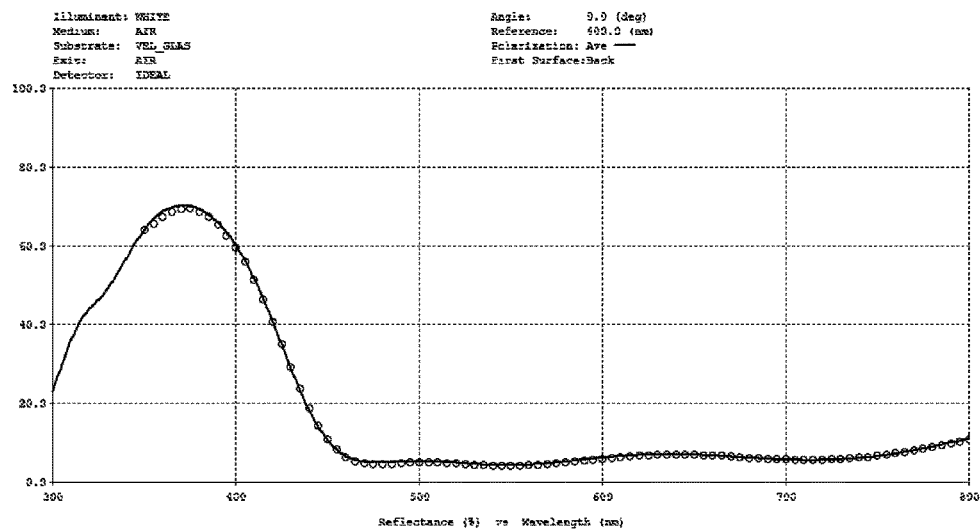
FIG. 10D is a graph showing the front side reflectance of an optical filter according to one embodiment of the present invention.

Model Confirmation:

The coatings described and shown in FIGS. 9A-9G were back modeled in TFCalc. FIG. 10A is a table showing the configuration of the back modeled coating stack that corresponds to the experimental coating employing a layer of absorbing Ni formed over 1 second. FIG. 10B shows the percent transmittance of experimental coating (circles) versus modeled data (solid lines) for the same coating; FIG. 10C shows the front side reflectance of experimental coating (circles) versus modeled data (solid lines) for the same coating; and FIG. 10D shows the backside reflectance of experimental coating (circles) versus modeled data (solid lines) for the same coating.

Figures 11A, 11B:
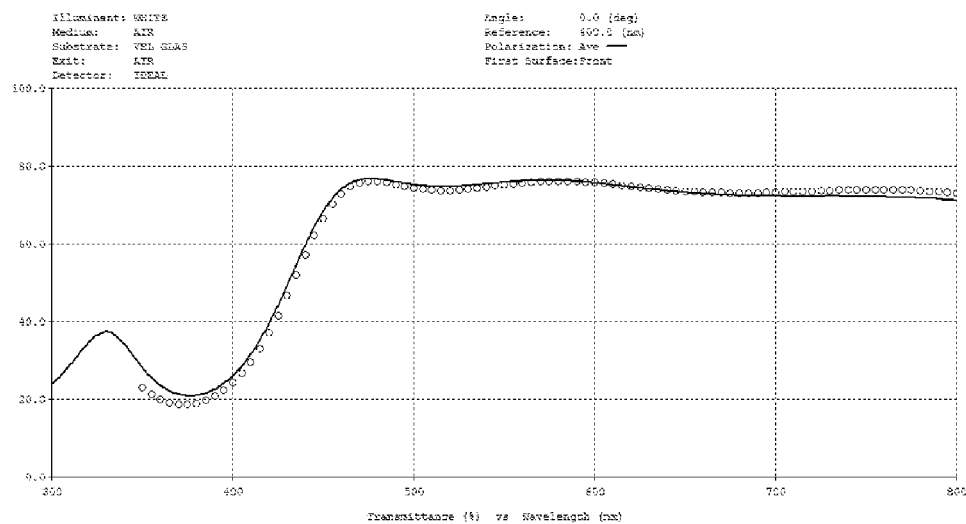
FIG. 11A is a table showing the configuration of an optical filter according to one embodiment of the present invention.
FIG. 11B is a graph showing the transmittance of an optical filter according to one embodiment of the present invention.
Figure 11C:
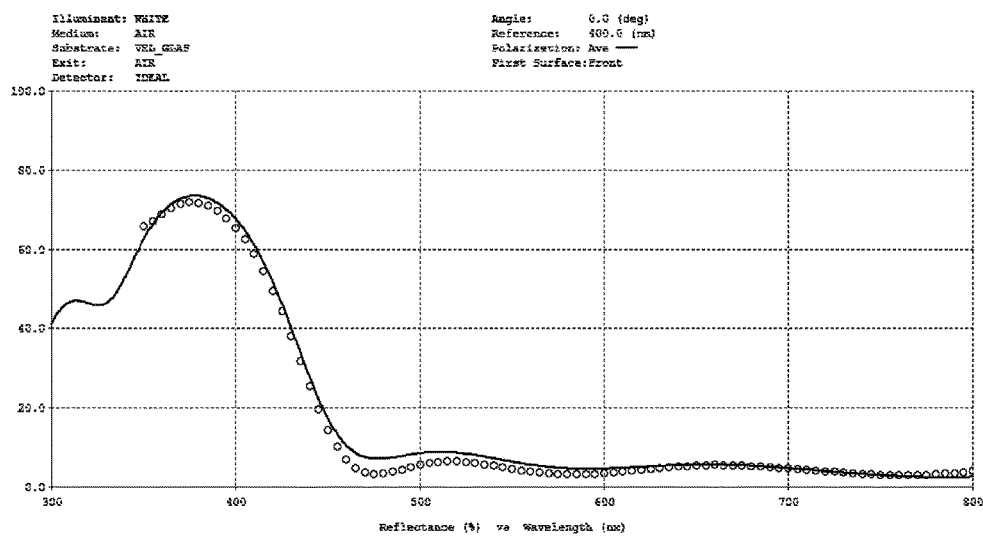
FIG. 11C is a graph showing the front side reflectance of an optical filter according to one embodiment of the present invention.
Figure 11D:
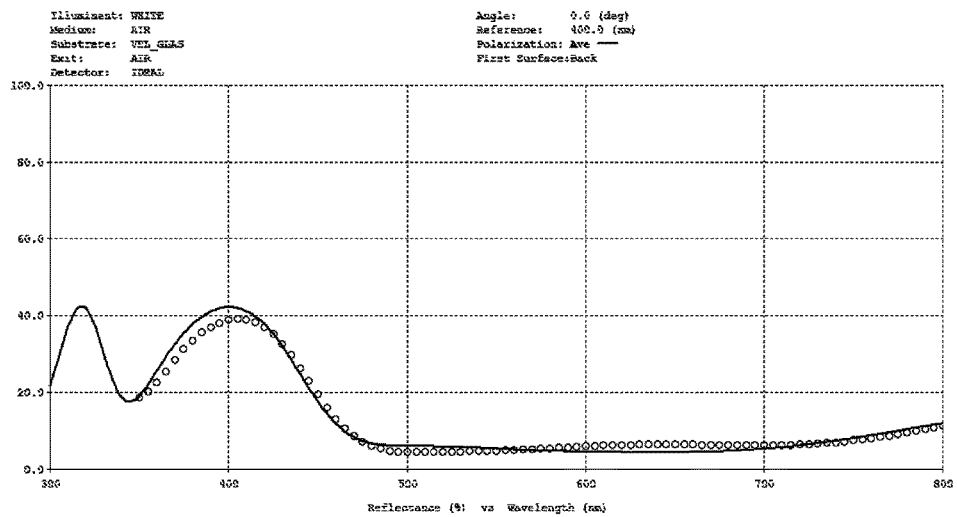
FIG. 11D is a graph showing the front side reflectance of an optical filter according to one embodiment of the present invention.

FIG. 11A is a table showing the configuration of the back modeled coating stack that corresponds to the experimental coating employing a layer of absorbing Zr formed over 7.5 seconds. FIG. 11B shows the percent transmittance of experimental coating (circles) versus modeled data (solid lines) for the same coating; FIG. 11C shows the front side reflectance of experimental coating (circles) versus modeled data (solid lines) for the same coating; and FIG. 11D shows the backside reflectance of experimental coating (circles) versus modeled data (solid lines) for the same coating. As evident from these figures, the agreement between the model and the experimental data is very good.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

What is claimed is:

1. An ophthalmic lens comprising:
a lens substrate;
an optical filter having a front surface and a back surface attached to a front surface of the lens substrate; and
a percent reflectance from a front surface of the ophthalmic lens 30 percent greater than a percent reflectance from the back surface of the optical filter.

2. The ophthalmic lens of claim 1 wherein the lens substrate is thermoplastic.

3. The ophthalmic lens of claim 1 wherein the lens substrate is a curable liquid monomer mixture or a curable urethane based prepolymer composition.

4. The ophthalmic lens of claim 1 further comprising a functional laminate distinct from the optical filter.

5. The ophthalmic lens of claim 1 wherein the optical filter comprises:
a plurality of alternating layers of transparent dielectric materials having different refractive indices; and
at least one layer of a metallic absorbing material having a thickness of less than 50 nm.

6. The ophthalmic lens of claim 1 wherein the optical filter comprises at least one layer of gold, titanium nitride and/or zirconium nitride.

7. A method for forming an optical article comprising:
obtaining an optical substrate;
forming an optical filter on the optical substrate comprising:
applying at least one layer of transparent dielectric material having a refractive index above 1.6 on a surface of the optical substrate;
applying at least one layer of transparent dielectric material having a refractive index less than or equal to 1.6 on the surface of the optical substrate; and
applying at least one layer of a metallic absorbing material on the surface of the optical substrate; and
imparting a percent reflectance from a front surface of the optical article 30 percent greater than a percent reflectance from a backside of the optical filter through said applying the at least one layer of a metallic absorbing material.

8. The method of claim 7 wherein applying at least one layer of the metallic absorbing material comprises applying a layer having a thickness of less than 50 nm.

9. The method of claim 7 wherein applying at least one layer of the metallic absorbing material comprises applying a conductive material.

10. The method of claim 7 wherein applying at least one layer of the metallic absorbing material comprises applying gold, titanium nitride and/or zirconium nitride.

11. The method of claim 7 wherein obtaining the optical substrate comprises obtaining a thermoplastic ophthalmic lens.

* * * * *